United States Patent [19]

Kovacich

[11] Patent Number: 5,328,551
[45] Date of Patent: Jul. 12, 1994

[54] METHOD OF MAKING HIGH OUTPUT STRAIN GAGE

[75] Inventor: John Kovacich, Wauwatosa, Wis.

[73] Assignee: Eaton Corporation, Cleveland, Ohio

[21] Appl. No.: 967,645

[22] Filed: Oct. 28, 1992

[51] Int. Cl.⁵ .................... C23F 1/00; G01L 1/00
[52] U.S. Cl. .................... 156/630; 156/632; 156/634; 156/652; 156/656; 156/659.1; 156/664; 29/621.1
[58] Field of Search ............ 156/630, 634, 629, 632, 156/656, 652, 659.1, 664; 29/621.1

[56] References Cited

U.S. PATENT DOCUMENTS

| | | | |
|---|---|---|---|
| 2,715,666 | 8/1955 | Stinchfield | 29/621.1 X |
| 2,933,665 | 4/1960 | Dimeff | 29/621.1 X |
| 3,922,628 | 11/1975 | Hudson et al. | 29/621.1 X |
| 5,049,232 | 9/1991 | Tola | 156/634 X |
| 5,193,402 | 3/1993 | Reed | 29/621 X |

FOREIGN PATENT DOCUMENTS

| | | | |
|---|---|---|---|
| 38402 | 2/1992 | Japan | 29/621.1 |
| 725092 | 3/1980 | U.S.S.R. | 29/621.1 |

*Primary Examiner*—Thi Dang
*Attorney, Agent, or Firm*—R. A. Johnston

[57] ABSTRACT

A method of making a foil-type electrical resistance strain gage having a gage factor of at least 4. A PtW foil is adhesively bonded to a polyimide substrate with an FEP adhesive cured under heat and pressure. The foil is spin-coated with a positive photoresist, masked, and exposed to ultraviolet light. The exposed photoresist is then developed, permitting wet etching of the foil to form a gage pattern on the substrate, which is then preferably cured.

7 Claims, 1 Drawing Sheet

METHOD OF MAKING HIGH OUTPUT STRAIN GAGE

BACKGROUND OF THE INVENTION

The present invention relates to electrical resistance strain gages of the type employed for measuring strains where it is desired to have a high output or gage factor. Gage factor is the dimensionless ratio of the ratio of the gage resistance in response to the strain divided by the strain ratio.

Typically, metal foil-type resistance strain gages have a gage factor of 2. However, where a high gage factor on the order of 4 is desired to provide appropriate gage sensitivity for driving a signal-generating circuit, it has been found that metal foil formed of exotic materials such as an alloy of Platinum and Tungsten provides the desired high gage factor.

Heretofore, Platinum-Tungsten (PtW) foil gages have been manufactured by ion beam milling, which required substantial investment for the ion beam milling machine. Furthermore, difficulties have been experienced in establishing process controls to provide the desired gage configuration with this process.

Thus it has been desired to find a way or means of fabricating high gage factor electrical resistance strain gages in a simple low-cost manner which produces reliable and accurate strain indication.

SUMMARY OF THE INVENTION

The present invention provides for a way of making electrical resistance strain gages from metal foil comprising an alloy of Tungsten and Platinum, which provide a relatively high gage factor on the order of a value of 4. The process of the present invention employs adhesively bonding the metal foil to a plastic substrate and curing the adhesive with heat and pressure. A positive photoresist is then applied to the foil and masked and exposed to ultraviolet light. The photoresist is then unmasked and developed in a first caustic wet-etching process to remove the exposed portion of the photoresist and a second acidic wet etching process to remove the foil underneath, leaving a foil gage formed on the substrate to which suitable electrical leads are attached. Preferably, the photoresist is applied by spin coating, and the structure is cured after any of the spin coating, developing, and etching.

DETAILED DESCRIPTION

DETAILED DESCRIPTION

Figure 1:
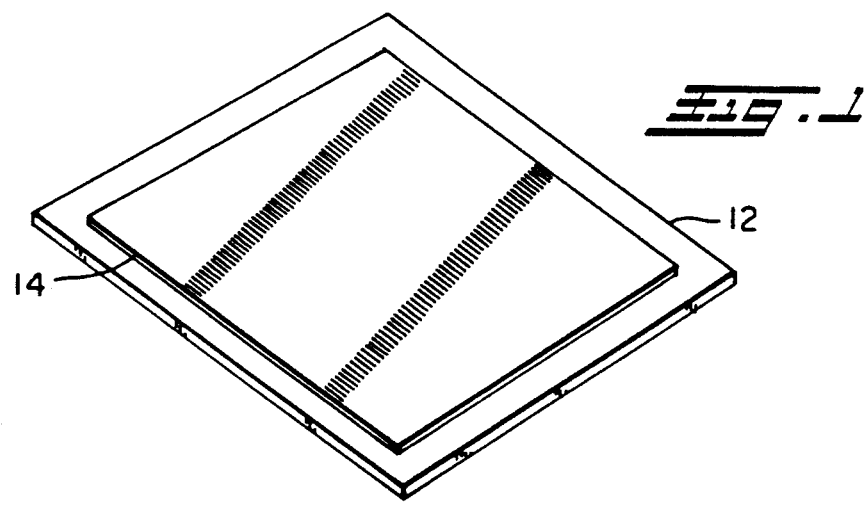
FIG. 1 is a perspective view of a foil coupon cemented to a substrate.

Referring to the drawings, an electrical foil strain gage indicated generally at 10 has a substrate of suitable plastic material indicated by reference numeral 12 and upon which has been adhesively attached a foil of tungsten platinum alloy indicated by reference numeral 14. In the presently preferred practice, the substrate is a polyimide plastic material having a thickness on the order of 0.001 inches (0.025 mm). The foil is attached to the substrate 12 as a coupon of rolled foil formed of preferably platinum tungsten material (PtW) having a thickness on the order of 0.0001 inches (2.5 microns).

The foil coupon is attached to the substrate by a suitable thermally activated adhesive layer. The assembly of the foil coupon on the substrate is then subjected to heat and pressure to cure the adhesive. In the presently preferred practice, the adhesive material has a significant percentage thereof comprising a fill of polytetrafluoro ethylene propylene material and ethylene propylene which makes it chemically inert to subsequent etching.

Figure 2:
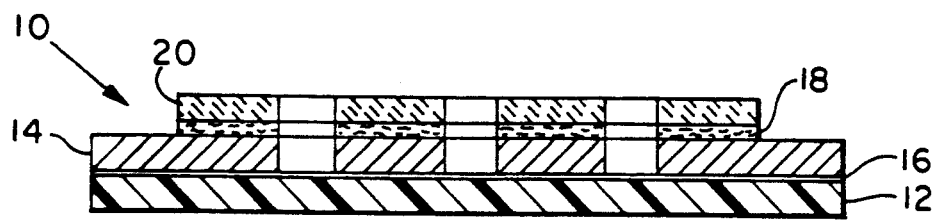
FIG. 2 is a cross-section of the gage of FIG. 1 with the mask in place prior to exposure; and, FIG. 3 is a perspective view of a finished gage made by the method of the present invention.
Figure 3:
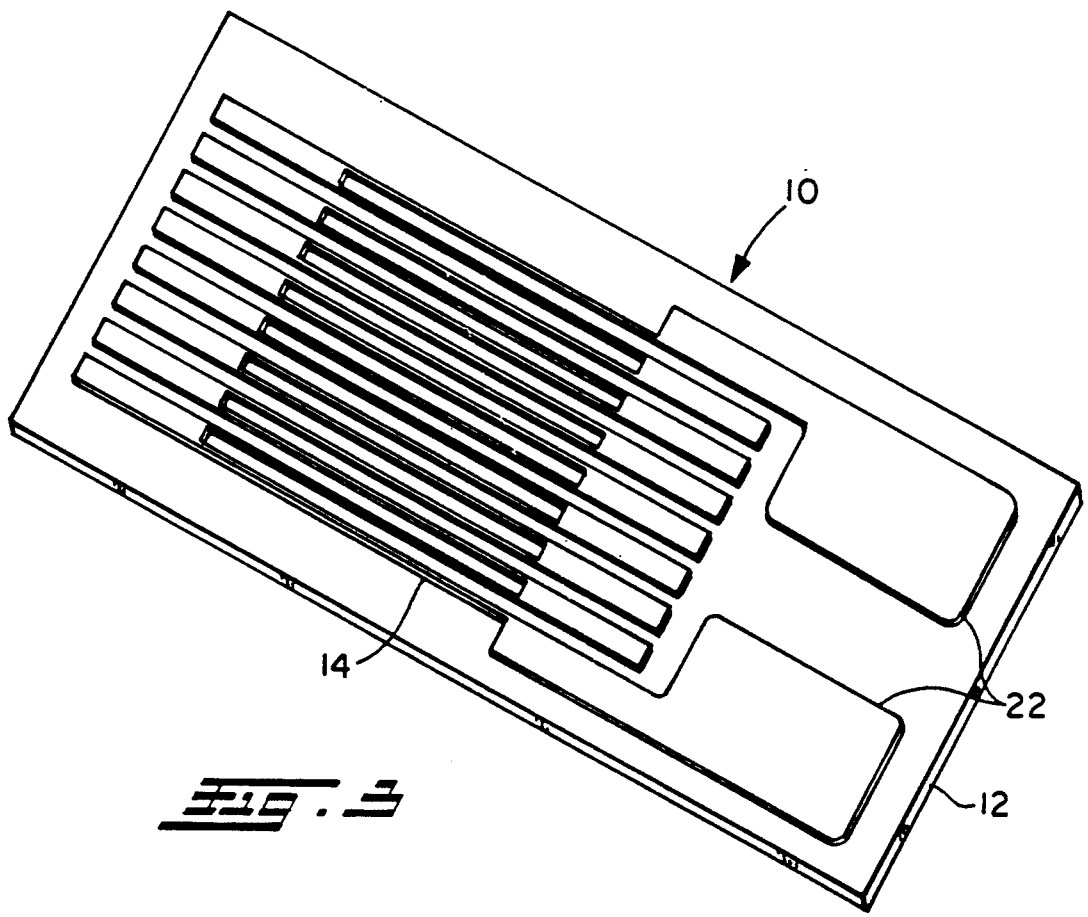

With reference to FIG. 2, a preferably positive photoresist layer denoted by reference numeral 18 is applied over the surface of the foil 14, preferably by spin coating. In the presently preferred practice, the photoresist is a cross-linked polymer material sensitive to exposure by ultraviolet light, which breaks the cross-linking. The layer of photoresist is then covered by a suitable mask, such as a glass photoplate on the order of 0.070 inches thickness (1.8 mm), and is exposed to the ultraviolet light, the mask removed and the exposed photoresist is developed. In the presently preferred practice, the photoresist is wet-etched in dilute potassium hydroxide at room temperature and subsequently etched at about 85 degrees Centigrade in an acidic mixture of hydrochloric acid, nitric acid, and water in the ratio 225:50:250, respectively, which causes the removal of the foil material 14 in the exposed regions of the photoresist, as shown in FIG. 2. The resultant structure is that of a patterned foil strain gage illustrated in FIG. 3, which has suitable mounting tabs or pads 22 onto which electrical leads may be attached, such as by soldering.

Preferably, after spin coating, developing, and etching, the finished gage 10 is subjected to a curing at a temperature of about 100 degrees Centigrade for a relatively short time interval; and, in the present practice, post-curing for 15 to 20 minutes has been found to be satisfactory.

The present invention thus provides a novel method for fabricating electrical resistance foil strain gages of the type having a gage factor of 4 by masking and wet-etching a photoresist coated metal foil to form a gage pattern thereon. The fabrication technique of the present invention is particularly applicable to metal foil strain gages employing an alloy of tungsten and platinum for the foil.

Although the invention has been described hereinabove with respect to the illustration in the drawings, it will be understood that the invention may be modified and varied, and is intended as limited only by the scope of the following claims.

I claim:

1. A method of making high output strain gages comprising:
   (a) providing a substrate or base of plastic material;
   (b) providing a thin foil of material consisting essentially of an alloy of tungsten and platinum (PtW) and adhesively bonding the foil to the substrate with a chemically inert adhesive;
   (c) applying heat and pressure to said adhesive bonding;
   (d) applying a photoresist coating to said foil;
   (e) masking said photoresist to a desired gage pattern and exposing the unmasked portion;
   (f) developing the unmasked photoresist and forming a gage pattern on said foil of said photoresist; and,
   (g) wet etching said foil with a mixture of nitric acid, hydrochloric acid, and water and forming a gage pattern with bonding pads in said adhesive and said substrate;

(h) attaching electrical leads to said bonding pads.

2. The method defined in claim 1, wherein said applying said photoresist includes spin coating.

3. The method defined in claim 1, wherein said developing includes wet-etching.

4. The method defined in claim 1, wherein said applying includes spin coating, further comprising curing said photoresist after said spin coating, and said developing, and curing said gage after said wet etching.

5. The method defined in claim 1, wherein said developing comprises using a dilute solution of potassium hydroxide for the wet etchant.

6. The method defined in claim 1, wherein said adhesive bonding includes using a polytetrafluoro ethylene propylene material.

7. The method defined in claim 1, wherein said providing a substrate comprises providing a substrate of polyimide material.

* * * * *